United States Patent [19]
Sigmon et al.

[11] Patent Number: 5,861,777
[45] Date of Patent: Jan. 19, 1999

[54] METHOD AND APPARATUS FOR COMPENSATION OF PHASE DISTORTION IN POWER AMPLIFIERS

[75] Inventors: Bernard Eugene Sigmon, Gilbert; Ronald Gene Myers, Scottsdale; Robert Michael Jackson, Gilbert, all of Ariz.

[73] Assignee: Motorola, Inc., Schaumburg, Ill.

[21] Appl. No.: 887,063

[22] Filed: Jul. 2, 1997

[51] Int. Cl.[6] .................................................. H03G 3/30
[52] U.S. Cl. ............................................. 330/136; 330/149
[58] Field of Search .............................. 330/52, 285, 149, 330/124 R, 133, 136; 375/297; 455/127

[56] References Cited

U.S. PATENT DOCUMENTS 5,251,330  10/1993  Chiba et al. ............................... 455/91
5,757,229   6/1998  Mitzlaff ............................... 330/124 R

OTHER PUBLICATIONS

An article entitled "Single–Sideband Transmission By Envelope Elimination And Restoration" by Leonard R. Kahn from Proceeding of the I.R.E., 1952.

*Primary Examiner*—Robert Pascal
*Assistant Examiner*—Patricia T. Nguyen
*Attorney, Agent, or Firm*—Dana B. LeMoine

[57] ABSTRACT

A method and apparatus for efficient power amplification with low phase distortion includes an envelope detector (30), a scaling amplifier (40), a driver amplifier (50), and a power amplifier (60). The scaling amplifier (40), in response to the envelope signal from the envelope detector (30), generates a bias signal which causes predistortion in the driver amplifier (50). The predistortion in the driver amplifier (50) compensates for phase distortion in the driver amplifier (50) and the power amplifier (60), resulting in low phase distortion output. An EER-type amplifier (200) with high efficiency utilizes the predistortion of a driver amplifier (250) to compensate for phase distortion in the driver amplifier (250) and a power amplifier (260).

18 Claims, 2 Drawing Sheets

METHOD AND APPARATUS FOR COMPENSATION OF PHASE DISTORTION IN POWER AMPLIFIERS

FIELD OF THE INVENTION

This invention relates in general to power amplifiers and, in particular, to high efficiency power amplifiers with reduced phase distortion.

BACKGROUND OF THE INVENTION

There are various apparatus available for amplifying signals. In amplifier applications that involve the amplification and transmission of modulated signals, a premium is placed on amplifier efficiency. In addition, because many modulated signals contain information in the amplitude envelope and the phase of the signal, a premium is placed on the ability to create a high fidelity reproduction of the signal. In particular, the amplifier preferably exhibits very low amplitude distortion and very low phase distortion.

Communications devices, which often transmit signals having information in both amplitude and phase, are an example application where these qualities are in demand. Low distortion allows the communications devices to communicate more reliably and high efficiency allows the devices to operate longer on a single battery.

One method of achieving increased efficiency is to use saturating amplifiers. Saturating amplifiers, such as class C amplifiers, achieve the goal of high efficiency at the expense of nonlinearity. Nonlinear amplifiers, however, cannot be used in applications where information is contained in the amplitude envelope because that information is corrupted by the nonlinear amplification. When amplitude information has been corrupted by a nonlinear amplifier, amplitude distortion has occurred.

Further, when power amplifiers are driven with high level input signals, a nonlinear phase response results. However, once again, amplifiers with nonlinear phase response cannot be used in applications where information is contained in the phase, because that information is corrupted by the nonlinear phase response, resulting in phase distortion and loss of information.

In addition to distortion and loss of information, nonlinear operation of saturated amplifiers causes an increase in intermodulation products. Intermodulation products cause undesirable amounts of energy to be present in frequency bands other than the one intended for use. This undesirable energy is commonly quantified and termed Adjacent Channel Power (ACP). Excessively high levels of ACP can cause an amplifier to be unsuitable for a particular application.

Since efficiency has traditionally been gained by driving amplifiers into saturation, and since driving amplifiers into saturation causes intermodulation products to rise, high efficiency and low intermodulation products have historically been traded off against each other. It would be very desirable to achieve low intermodulation products in a highly efficient saturating amplifier, thereby obviating the need for a trade-off between the two.

Accordingly, there is a need for a high efficiency saturating amplifier with a linear amplitude response and resulting low amplitude distortion. There is also a significant need for a high efficiency linear power amplifier with reduced phase distortion. There is also a need for a high efficiency saturating amplifier that exhibits low intermodulation products.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION OF THE DRAWINGS

Generally, the present invention helps solve the above-identified problems by providing an apparatus and method for reducing phase distortion in high efficiency linear power amplifiers.

In accordance with a first embodiment of the present invention, the apparatus includes a power amplifier circuit for amplifying an input signal. The power amplifier circuit includes an envelope detector for producing an envelope signal from an input signal, a scaling amplifier coupled to the envelope detector for summing the envelope signal with a nominal gate bias to produce a gate bias signal, and a power amplifier coupled to the input of the power amplifier circuit and to an output of the power amplifier circuit, where the power amplifier comprises an amplifier stage biased with the gate bias signal.

In accordance with another embodiment of the present invention, the apparatus includes a power amplifier with reduced phase distortion. The power amplifier includes a driver amplifier stage which receives an input signal, a power amplifier stage driven by the driver amplifier stage, and a scaling amplifier for modulating a gate bias of the driver amplifier stage.

In accordance with another embodiment of the present invention, the apparatus includes a communications device. The communications device comprises a power amplifier which includes a driver amplifier stage which receives an input signal, a power amplifier stage driven by the driver amplifier stage, and a scaling amplifier for modulating a gate bias of the driver amplifier stage.

In accordance with another embodiment of the present invention, a method of compensating for phase distortion in a power amplifier includes the steps of detecting an envelope of a signal, scaling the resulting envelope signal, summing the scaled envelope signal with a nominal gate bias to produce a power amplifier gate bias used to bias the power amplifier thereby compensating for phase distortion.

In accordance with another embodiment of the present invention, a method of compensating for phase distortion in an EER-type amplifier includes the steps of envelope detecting an input signal, amplifying the envelope signal to produce a signal used to modulate a power amplifier stage, scaling the envelope signal to produce a scaled envelope signal, and summing the scaled envelope signal with a nominal gate bias signal to produce a driver amplifier gate bias which is used to bias a driver amplifier stage thereby compensating for phase distortion.

It is to be understood that many of the specific details of any particular exemplary embodiment are disclosed herein to satisfy the best mode requirement and do not in any way limit the scope of the invention.

Figure 1:
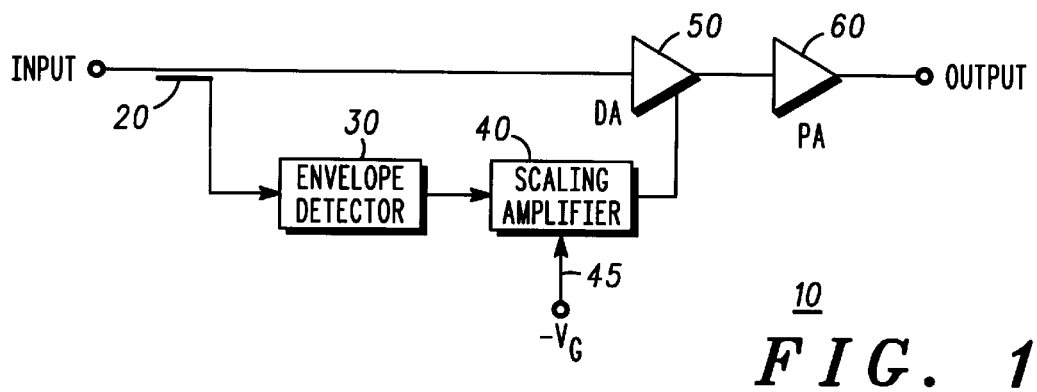
FIG. 1 shows a diagram of a power amplifier circuit in accordance with a preferred embodiment of the present invention.

FIG. 1 shows a diagram of a power amplifier circuit in accordance with a preferred embodiment of the present invention. FIG. 1 shows a power amplifier circuit 10 which includes coupler 20, envelope detector 30, scaling amplifier 40, driver amplifier 50, and power amplifier 60.

In operation, an input signal is input to power amplifier circuit 10, which is then input to driver amplifier 50. Envelope detector 30 detects the envelope of the input signal and produces an envelope signal. The envelope signal is input to scaling amplifier 40. Scaling amplifier 40 scales the envelope signal and sums a nominal gate bias signal 45 to produce a gate bias signal for driver amplifier 50. Driver amplifier 50, in response to the gate bias signal, amplifies the input signal and drives power amplifier 60. Power amplifier 60 receives the output of driver amplifier 50 and produces an output signal which is the output of power amplifier circuit 10.

Power amplifier devices, such as driver amplifier 50 and power amplifier 60 exhibit varying amounts of phase distortion when driven at high input signal levels. Through the operation of envelope detector 30, nominal gate bias signal 45, and scaling amplifier 40, a gate bias signal is produced for driver amplifier 50. The gate bias signal for driver amplifier 50 causes the output of driver amplifier 50 to be distorted in response to the envelope of the original input signal. In a preferred embodiment, the distortion in driver amplifier 50 as a result of the gate bias signal compensates for the distortion otherwise present in driver amplifier 50 and power amplifier 60. The output of driver amplifier 50 then, is predistorted in response to the gate bias signal such that the distortion caused by power amplifier 60 cancels the predistortion and the resulting output signal is a high fidelity reproduction of the input signal.

Because the distortion of a power amplifier is typically a function of the input signal drive level, predistorting driver amplifier 50 with envelope information derived from the input signal provides a means for reducing overall distortion otherwise present in power amplifier 60. Reduced phase distortion in a power amplifier provides for a decrease in intermodulation products. The decrease in intermodulation products reduces adjacent channel power, a recognized measure of power amplifier performance.

For simplicity, FIG. 1 shows a single driver amplifier 50 and a single power amplifier 60. Multiple driver amplifiers can be used as can multiple power amplifiers.

Figure 2:
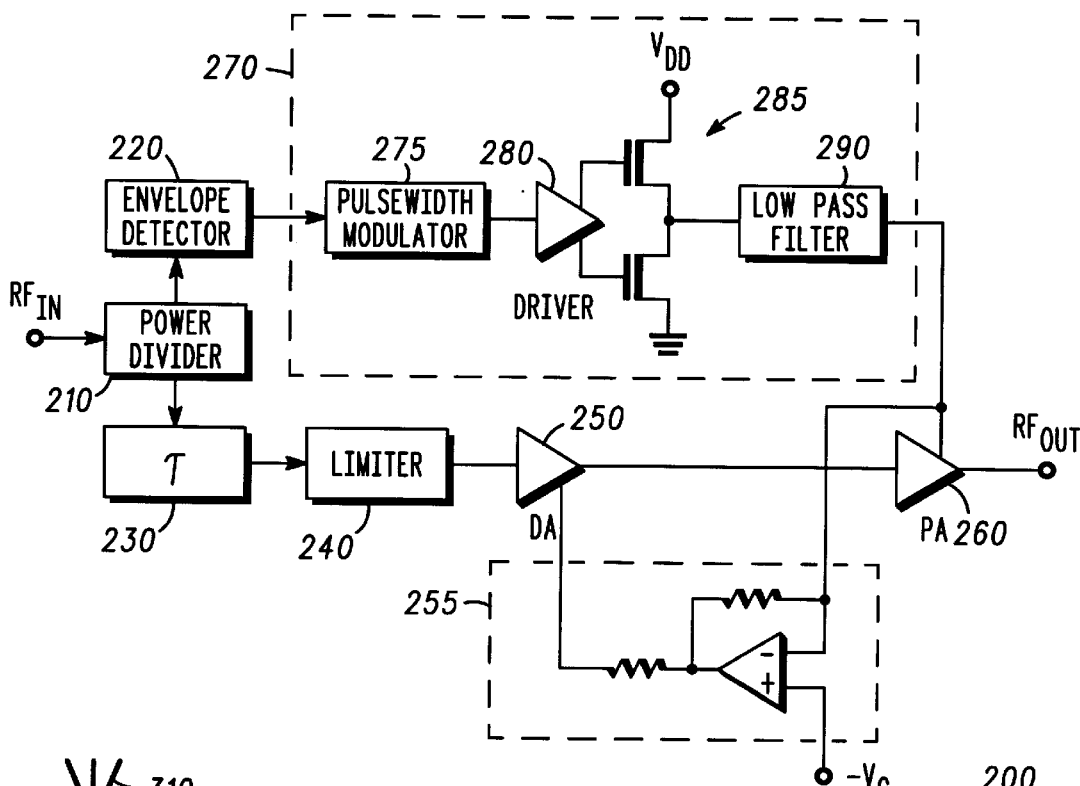
FIG. 2 shows a diagram of an EER-type amplifier in accordance with a preferred embodiment of the present invention.

FIG. 2 shows a diagram of an EER-type amplifier in accordance with a preferred embodiment of the present invention. EER-type amplifiers such as the one shown in FIG. 2 are recognized as high efficiency amplifiers.

Envelope elimination and restoration (EER) is a technique through which highly efficient but nonlinear RF power amplifiers can be combined with other, highly efficient amplifiers to produce a high efficiency linear amplifier system. The detected envelope is amplified efficiently by a class S or other highly efficient power amplifier which only has to operate at the bandwidth of the RF envelope. Amplitude modulation of the final RF power amplifier restores the envelope to the phase modulated carrier creating an amplified replica of the input signal.

EER-type amplifier 200 includes power divider 210, envelope detector 220, envelope amplifier 270, time delay 230, limiter 240, driver amplifier 250, scaling amplifier 255, and power amplifier 260. EER-type amplifier 200 receives an RF input into power divider 210.

Power divider 210 splits the RF input signal into an amplitude path which feeds envelope detector 220, and a phase path which feeds time delay 230. The power split could be equal or unequal and with any arbitrary phase difference between the two output ports.

The phase path of EER-type amplifier 200 includes time delay 230, which produces a delay equal to that introduced by the low pass filters in the amplitude path. Limiter 240 receives the time delayed signal output from time delay 230. Limiter 240 amplitude limits the input signal so that the output of limiter 240 contains phase information with little or no amplitude information. The amplitude limited signal output from limiter 240, is then input to driver amplifier 250 which, in turn, drives power amplifier 260.

The amplitude path of EER-type amplifier 200 includes envelope detector 220 and envelope amplifier 270. Envelope detector 220 detects the envelope of the RF input signal and outputs an envelope signal which represents the amplitude information contained in the original RF input signal. To minimize distortion, envelope detector 220 is preferably a synchronous detector based upon a double balanced mixer.

Envelope amplifier 270 amplifies the envelope signal output from envelope detector 220 and drives the drain bias of power amplifier 260. Because envelope amplifier 270 only needs to operate at the bandwidth of the envelope rather than at the much higher RF bandwidth, envelope amplifier 270 can be an inexpensive and efficient amplifier with lower bandwidth requirements. One skilled in the art will recognize that there are many possible ways to implement envelope amplifier 270, but in a preferred embodiment as shown in FIG. 2, envelope amplifier 270 is a class S amplifier.

Envelope amplifier 270 includes pulsewidth modulator (PWM) 275, driver 280, switching transistors 285, and low pass filter 290. PWM 275 performs pulsewidth modulation of the envelope signal output from envelope detector 220 to produce a pulsewidth modulated signal that is fed to driver 280. Switching transistors 285 and low pass filter 290, in response to driver 280, produce a signal that is an amplified version of the output of envelope detector 220. Filtering by low pass filter 290 causes the output of envelope amplifier 270 to be time delayed with respect to the RF input signal. As previously discussed, the delay introduced by low pass filter 290 matches the time delay introduced by time delay 230 such that the resulting output has the phase and amplitude properly recombined.

The envelope signal is amplified to a level commensurate with the desired output. The output of the final envelope amplifier is the DC power supply for a final RF power amplifier. The resultant remodulation of the phase modulated RF carrier restores the envelope, producing an amplified replica of the input signal.

The embodiment of the EER-type amplifier circuit as shown in FIG. 2 varies the bias of power amplifier 260 in such a way as to maintain operation near saturation and therefore in a region of high efficiency.

The envelope signal is also input to scaling amplifier 255. Scaling amplifier 255 scales the envelope signal and sums a nominal gate bias signal to produce a gate bias signal for driver amplifier 250. Driver amplifier 250, in response to the gate bias signal, amplifies the input signal and drives power amplifier 260. Power amplifier 260 receives the output of driver amplifier 250 and produces an output signal which is the output of EER-type amplifier 200.

Scaling amplifier 255 is shown as a circuit comprising an operational amplifier. Of course, other circuits topologies could be used to scale the amplitude information and sum a nominal bias to drive the gate bias of driver amplifier 250, while still practicing the present invention. Further, the nominal gate bias may be introduced within the scaling amplifier rather than being summed in from an external source.

In addition, multiple driver amplifiers can be utilized, each with a separate gate bias signal derived from the envelope information.

Through the operation of envelope detector 220, the nominal gate bias signal, and scaling amplifier 255, a gate bias signal is produced for driver amplifier 250. The gate bias signal for driver amplifier 250 causes the output of driver amplifier 250 to be distorted in response to the envelope of the original input signal. In a preferred embodiment, the distortion in driver amplifier 250 as a result of the gate bias signal compensates for the distortion otherwise present in driver amplifier 250 and power amplifier 260. The output of driver amplifier 250 then, is predistorted in response to the gate bias signal such that the distortion caused by power amplifier 260 cancels the predistortion and the resulting output signal is a high fidelity reproduction of the input signal.

In practice, experimental results have shown that a significant improvement in intermodulation products can be achieved with the gate bias predistortion in the EER-type amplifier as shown in FIG. 2. The method and apparatus of the present invention as embodied in FIG. 2 sufficiently improves the intermodulation performance of the EER-type amplifier to allow full power, saturated operation and still meet strict adjacent channel power requirements that otherwise could not be met.

Figure 3:
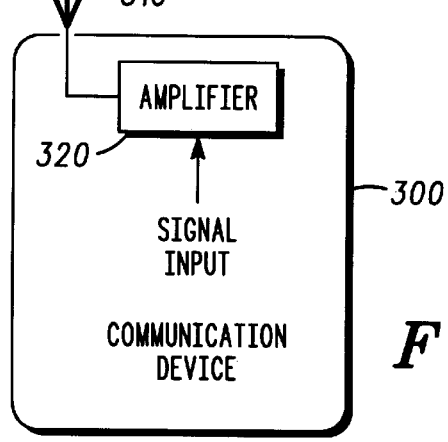
FIG. 3 shows a diagram of a communications device in accordance with a preferred embodiment of the present invention.

FIG. 3 shows a diagram of a communications device in accordance with a preferred embodiment of the present invention. Communications device 300 includes power amplifier circuit 320 and antenna 310. Power amplifier circuit 320 may be any of the low phase distortion amplifiers of the present invention, including for example, power amplifier circuit 10 (FIG. 1) or EER-type amplifier 200 (FIG. 2). Communications device 300 may be one of many different devices capable of communications. Examples include, but are not limited to, individual subscriber units in a satellite communications system, amateur radios, business band radios, and cellular phones.

Figure 4:
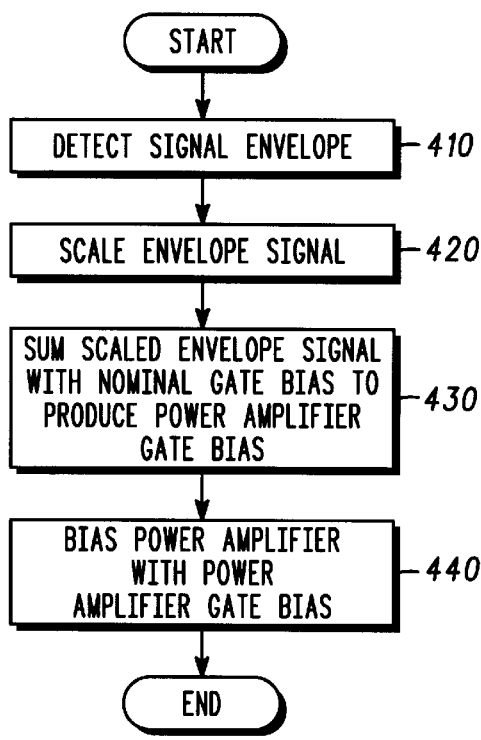
FIG. 4 shows a flow chart for a method of compensating for phase distortion in a power amplifier in accordance with a preferred embodiment of the present invention.

FIG. 4 shows a flow chart for a method of compensating for phase distortion in a power amplifier in accordance with a preferred embodiment of the present invention. In step 410, the input signal is envelope detected. Then in step 420, the envelope signal is scaled. In step 430, the scaled envelope signal is summed with a nominal gate bias signal to produce a power amplifier gate bias. After step 430, in step 440, a power amplifier is biased with the power amplifier gate bias.

Figure 5:
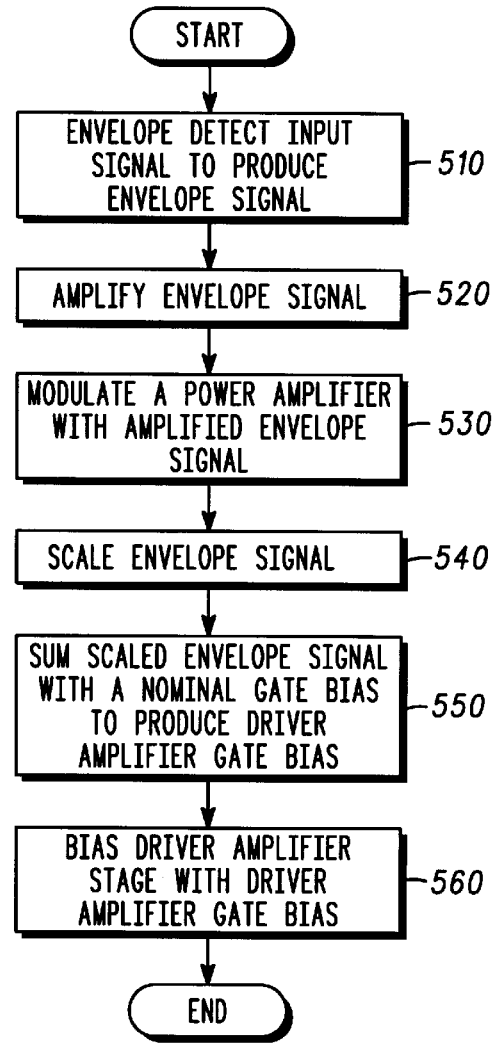
FIG. 5 shows a flow chart for a method of compensating for phase distortion in an EER-type amplifier in accordance with a preferred embodiment of the present invention.

FIG. 5 shows a flow chart for a method of compensating for phase distortion in an EER-type amplifier in accordance with a preferred embodiment of the present invention. In step 510, the input signal is envelope detected. Then in step 520, the envelope signal is amplified. In step 530, a power amplifier is modulated with the amplified envelope signal. In step 540, the envelope signal is scaled, and in step 550, the scaled envelope signal is summed with a nominal gate bias signal to produce a driver amplifier gate bias. Then in step 560, a driver amplifier is biased with the driver amplifier gate bias.

In summary, the method and apparatus of the present invention provide a means for operating a saturating amplifier at full power with acceptably low intermodulation products. In addition, the method and apparatus of the present invention as described represent a versatile way of achieving low phase distortion in a high efficiency, linear power amplifier. Highly efficient linear amplifiers with low phase distortion are very useful in the amplification of modulated signals which contain information in both amplitude and phase. Communications devices, which often transmit signals having information in both amplitude and phase, benefit greatly from the apparatus and method of the present invention. Low distortion allows the communications devices to communicate more reliably and high efficiency allows the devices to operate longer on a single battery.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A power amplifier circuit for amplifying an input signal, said power amplifier circuit comprising:

an envelope detector for producing an envelope signal from said input signal;

an envelope amplifier coupled to said envelope detector for producing an amplified envelope signal;

a scaling amplifier for summing said amplified envelope signal with a nominal gate bias to produce a gate bias signal; and a power amplifier for amplifying said input signal, wherein said power amplifier comprises a driver amplifier stage biased with said gate bias signal, and a final power amplifier stage modulated with said amplified envelope signal.

2. A power amplifier circuit for amplifying an input signal, said power amplifier circuit comprising:

an envelope detector for producing an envelope signal from said input signal;

an envelope amplifier coupled to said envelope detector for producing an amplified envelope signal, wherein said envelope amplifier comprises a class S modulators;

a scaling amplifier for summing said amplified envelope signal with a nominal gate bias to produce a gate bias signal; and a power amplifier for amplifying said input signal, wherein said power amplifier is biased with said gate bias signal.

3. The power amplifier circuit of claim 2 wherein said scaling amplifier comprises an operational amplifier.

4. A power amplifier with reduced phase distortion, said power amplifier comprising:

a driver amplifier stage which receives an input signal;

a power amplifier stage having an input coupled to an output of said driver amplifier stage, and having an output for producing an output signal;

a scaling amplifier for modulating a gate bias of said driver amplifier stage;

an envelope detector for detecting an envelope of the input signal to produce an envelope signal, wherein said scaling amplifier is responsive to said envelope signal; and an envelope amplifier coupled to said envelope detector, for producing an amplified envelope signal.

5. The power amplifier of claim 4 wherein said power amplifier stage is modulated by said amplified envelope signal.

6. The power amplifier of claim 5 wherein said envelope amplifier comprises a class S modulator.

7. A communications device comprising:

a power amplifier circuit wherein said power amplifier circuit comprises:
  (i) a driver amplifier stage which receives an input signal;
  (ii) a power amplifier stage having an input coupled to an output of said driver amplifier stage, and having an output for producing an output signal;
  (iii) an envelope detector for detecting an envelope of the input signal to produce an envelope signal;
  (iv) an envelope amplifier coupled to said envelope detector, for producing an amplified envelope signal; and
  (v) a scaling amplifier for modulating a gate bias of said driver amplifier stage.

8. In an EER-type amplifier which introduces phase distortion in a signal path, a method of reducing said phase distortion, said method comprising the steps of:

envelope detecting an input signal to produce an envelope signal;

amplifying said envelope signal to produce an amplified envelope signal;

modulating a power amplifier stage with said amplified envelope signal;

scaling said envelope signal to produce a scaled envelope signal;

summing said scaled envelope signal with a nominal gate bias signal to produce a driver amplifier gate bias; and biasing a driver amplifier stage with said driver amplifier gate bias.

9. The method of claim 8 wherein said amplifying step comprises:

producing a pulsewidth modulated signal with a duty cycle proportional to an amplitude of said envelope signal; and filtering said pulsewidth modulated signal to produce said amplified envelope signal.

10. The power amplifier circuit of claim 1 wherein said scaling amplifier scales said amplified envelope signal prior to summing.

11. The power amplifier circuit of claim 1 wherein said envelope amplifier comprises a class S modulator.

12. The power amplifier circuit of claim 1 wherein said scaling amplifier comprises an operational amplifier.

13. The power amplifier circuit of claim 2 wherein said scaling amplifier scales said amplified envelope signal prior to summing.

14. The power amplifier circuit of claim 2 wherein said power amplifier is modulated with said amplified envelope signal.

15. The power amplifier of claim 4 wherein said scaling amplifier scales said amplified envelope signal to produce a scaled envelope signal.

16. The power amplifier of claim 15 wherein said scaling amplifier sums said scaled envelope signal and a nominal gate bias.

17. The communications device of claim 7 wherein said scaling amplifier scales said amplified envelope signal to produce a scaled envelope signal.

18. The communications device of claim 17 wherein said scaling amplifier sums said scaled envelope signal and a nominal gate bias.

* * * * *